US006300855B1

(12) United States Patent
Clark et al.

(10) Patent No.: US 6,300,855 B1
(45) Date of Patent: Oct. 9, 2001

(54) HYSTERESIS REDUCTION IN GIANT MAGNETOSTRICTIVE MATERIALS

(75) Inventors: Arthur E. Clark, Adelphi; James B. Restorff, College Park; Marilyn Wun-Fogle, Gaithersburg, all of MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 09/217,129

(22) Filed: Dec. 21, 1998

(51) Int. Cl.[7] .............................. H01L 41/20; H04B 11/00
(52) U.S. Cl. ............................................. 335/215; 310/26
(58) Field of Search ................................. 335/215; 310/26

(56) References Cited

U.S. PATENT DOCUMENTS 4,308,474 * 12/1981 Savage et al. ..................... 310/26
5,792,284 * 8/1998 Cedell et al. ..................... 148/301

OTHER PUBLICATIONS

Article entitled "Anisotrophy of Single Crystal $Ho_xDy_yTb_{1-x-y}Fe_2$ Laves Phase Compounds," Physics 86–88B, 147–148 (1977).

* cited by examiner

Primary Examiner—Ramon M. Barrera
(74) Attorney, Agent, or Firm—Roger D. Johnson

(57) ABSTRACT

A high power magnetostrictive transducer element comprising a material of the formula $Tb_xDy_yHo_zFe_{2-w}$ wherein $0.24 \leq x \leq 0.28$, $0.52 \leq y \leq 0.56$, $0.13 \leq z \leq 0.22$, $x+y+z=1$, and $0 \leq w \leq 0.20$ and wherein the material is prestressed by a compressive force of from about 5 to about 100 MPa.

45 Claims, 3 Drawing Sheets

HYSTERESIS REDUCTION IN GIANT MAGNETOSTRICTIVE MATERIALS

BACKGROUND

This invention relates to magnetostrictive materials and more particularly to rare earth-iron magnetostrictive materials.

It has recently become apparent that the primary loss mechanism in high power devices employing giant magnetostrictive materials is hysteresis losses. Even at low audio frequencies, this loss far exceeds the sum of all other losses, which include Cu-coil loss, Terfenol eddy current losses, and eddy current loses in the Cu and in d. c. biasing magnets. While the lowered efficiency may be a significant drawback, the most deleterious effect of the loss is often excessive heating, requiring increased complexity with associated increased costs to cool the device.

The desired new magnetostrictive transducer element should combine a very low magnetization hysteresis with a giant magnetostrictive effect. Moreover the transducer element should not be more expensive to make or operate than prior art transducer elements.

SUMMARY

Accordingly, an object of this invention is to provide a new method of converting magnetic energy into mechanical energy.

Another object of this invention is to provide a more efficient high powered conversion of electrical or magnetic energy into mechanical energy using a magnetostrictive transducer.

A further object of this invention is to prove a new method of converting magnetic energy into mechanical energy using a magnetostrictive transducer element which has a low hysteresis loss but a large magnetostriction.

Still another object of this invention is to provide a new magnetostrictive material which can be used to producer powerful sound projectors and actuators which do not require cooling mechanisms.

These and other objects of this invention are achieved by providing a transducer for converting magnetic energy into mechanical energy comprising:

A. a magnetostrictive element comprising a magnetostrictive material of the formula $Tb_xDy_yHo_zFe_{2-w}$ wherein $0.24 \leq x \leq 0.28$, $0.52 \leq y \leq 0.56$, $0.13 \leq z \leq 0.22$, $x+y+z=1$, and $0 \leq w \leq 0.20$ and wherein the magnetostrictive element is prestressed by applying a compressive force of from about 5 to about 100 MPa to it; and B. conductive means for generating a magnetic field in the magnetostrictive element.

DESCRIPTION OF THE DRAWINGS

A more complete appreciation of the invention and many of its attendant advantages will be readily appreciated as the same becomes better understood by reference to the following detailed description when considered in connection with the accompanying drawings wherein.

These figures are described in more detail in the experimental section.

DESCRIPTION

The magnetostrictive element of the transducer is preferably composed of an alloy of the formula $$Tb_xDy_yHo_zFe_{2-w}$$

wherein preferably $0.24 \leq x \leq 0.28$, more preferably $0.25 \leq x \leq 0.27$, and most preferably x is about 0.26; wherein preferably $0.52 \leq y \leq 0.56$, more preferably $0.53 \leq y \leq 0.55$, and most preferably y is about 0.54; wherein preferably $0.13 \leq z \leq 0.22$, more preferably $0.17 \leq z \leq 0.21$, and most preferably z is about 0.20; and wherein $x+y+z=1$. Further, wherein preferably $0 \leq w \leq 0.20$, more preferably $0 \leq x \leq 0.10$, and most preferably w is about 0.05. For a given Ho concentration it is most preferable that the Dy and Tb concentrations are selected to place the composition on a linear minimum anisotropy line formed by compounds of the form:

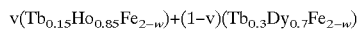
$$v(Tb_{0.15}Ho_{0.85}Fe_{2-w})+(1-v)(Tb_{0.3}Dy_{0.7}Fe_{2-w})$$

wherein $0 \leq v \leq 1$ and $0 \leq w \leq 0.20$.

The magnetostrictive material may be a randomly oriented (isotropic) material, a grain-oriented (highly textured) crystalline material, such as a grain-oriented polycrystalline material, or a single crystalline material. The grain-oriented crystalline material is preferably oriented along the, or axis and the single crystal material is preferably oriented along the, or axis. The greater the grain orientation, the more efficient the material will be in the transducer. However, the greater grain orientation results in a increase in the cost of preparing the material.

In the present invention, the magnetostrictive transducer elements operate at stress levels of preferably from about 5 to about 100 MPa. High power magnetostrictive transducers according to this invention operate at stress levels of more preferably from 30 to 100 MPa, still more preferably from 50 to 100 MPa, even more preferably from 50 to 80 MPa, and yet more stress levels of more preferably 5 to 30 MPa and still more preferably 10 to 25 MPa. For greater power output, a compressive force is applied to the magnetostrictive material to prestress it up into the range of stress that it will be operating at. Thus, preferably a compressive stress of from about 5 to about 100 MPa is applied to the magnetostrictive material. For high power transducers a compressive stress of more preferably from 30 to 100 MPa, still more preferably from 50 to 100 MPa, even more preferably from 50 to 80 MPa, and yet more preferably from 60 to 80 MPa is applied to the magnetostrictive material. For lower power transducers a compressive stress of more preferably 5 to 30

MPa and still more preferably 10 to 25 MPa is applied to the magnetostrictive material.

Figure 3:
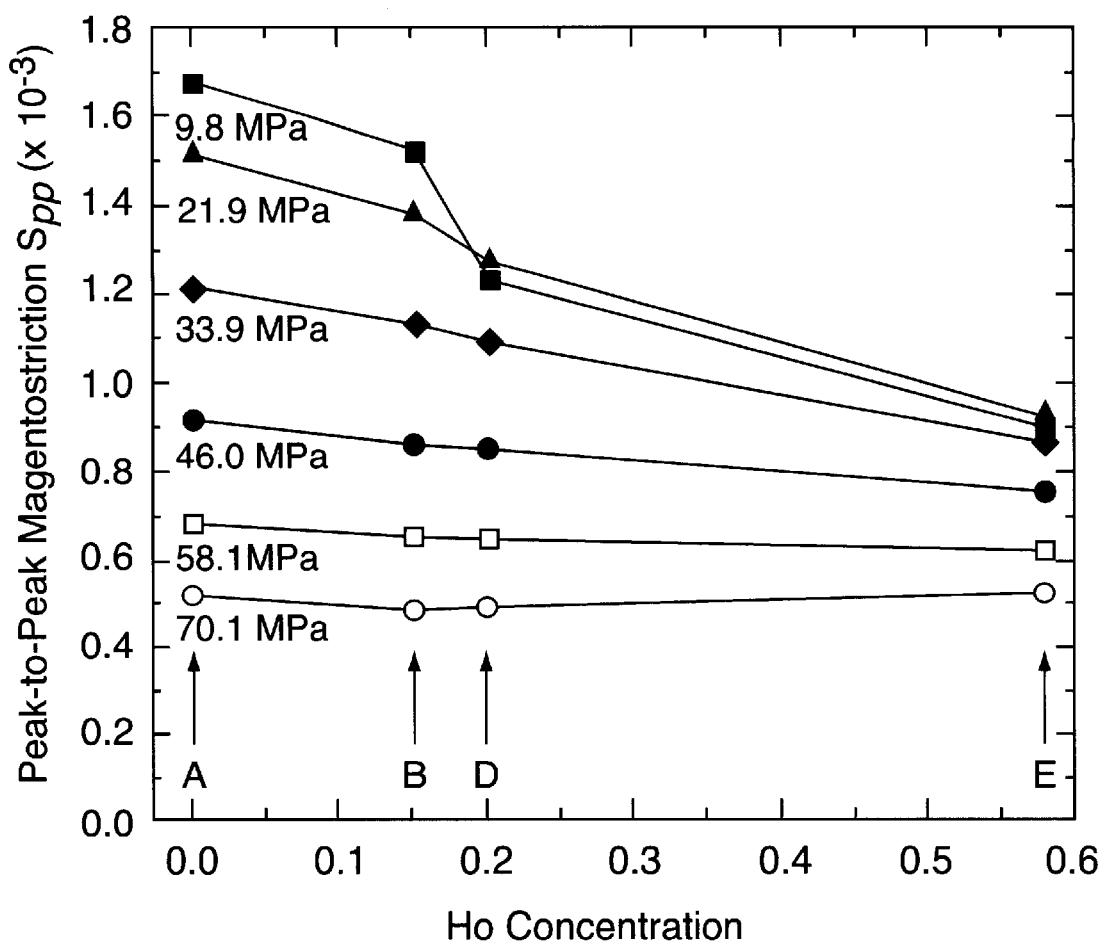
FIG. 3 shows the peak-to-peak magnetostriction $S_{pp}$ versus holmium (Ho) concentration as a function of applied stress for the samples (A, B, D, and E) that lie along the minimum anisotropy line.
Figure 4:
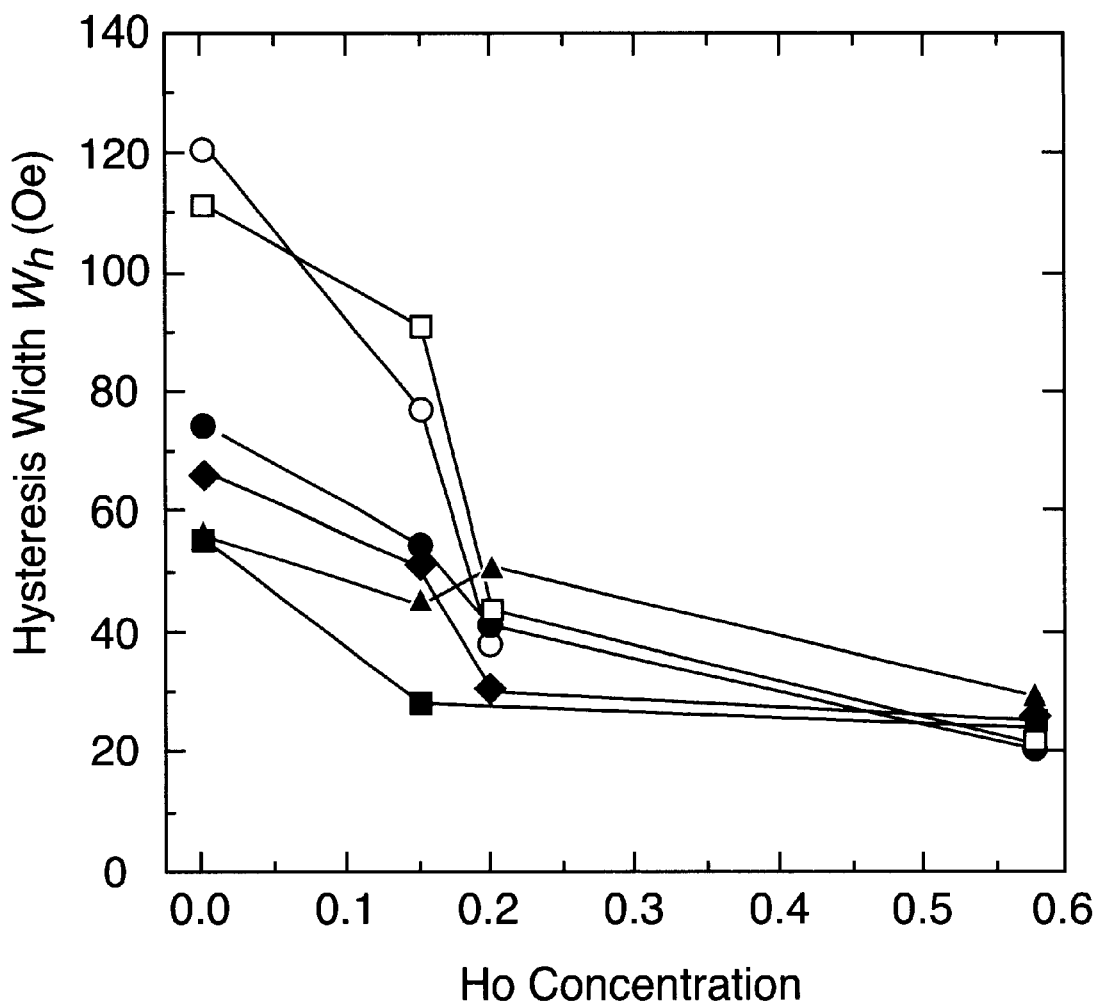
FIG. 4 shows the hysteresis width $W_h$ versus holmium (Ho) concentration for samples A, B, D, and E for various applied stresses.

The high power magnetostrictive transducers of this invention operate with less hysteresis and thus greater efficiency with less waste heat to dissipate. As shown in FIGS. 3 and 4, the power transducers operate with a substantially reduced hysteresis loss and thus are siderably more efficient.

The general nature of the invention having been set forth, the following example is ented as specific illustration thereof. It will be understood that the invention is not limited to this specific example but is susceptible to various modifications that will be recognized by one of ordinary skill in the art.

Methods which may be used to prepare the (1) randomly oriented (isotropic) (2) grain-oriented (highly textured), and (3) single crystal rare earth-iron magnetostrictive materials used in this invention are disclosed in U.S. Pat. No. 4,308,474, titled "Rare Earth-Iron Magnetostrictive Materials and Devices Using These Materials," which issued on Dec. 29, 1981 to Howard T. Savage, Arthur E. Clark, and O. Dale McMasters, and which is hereby incorporated by reference in its entirety.

Test and measurements in the following experimental section were performed at room temperature.

EXPERIMENTAL

Five $Tb_xDy_yHo_zFe_{1.95}$ (x+y+z=1) samples (0.48 cm diam × 1.91 cm long) were prepared using a free standing zone melt method. The samples were purchased from ETREMA Products, Ames, IA. A slightly iron deficient alloy ($Fe_{1.95}$ instead of $Fe_2$) is used in order to create a small amount of rate earth eutectic which thereby increases the mechanical robustness of the samples. The compositions (samples A, B, C, D, and E) examined in this study are shown in Table 1 along with the saturation magnetostriction $S_{sat}$. For a given Ho concentration, all of the samples except sample C lie on a linear minimum anisotropy line created by compounds of the from:

$$v(Tb_{0.15}Ho_{0.85}Fe_2)+(1-v)(Tb_{0.3}Dy_{0.7}Fe_2), 0 \leq v \leq 1.$$

Figure 1:
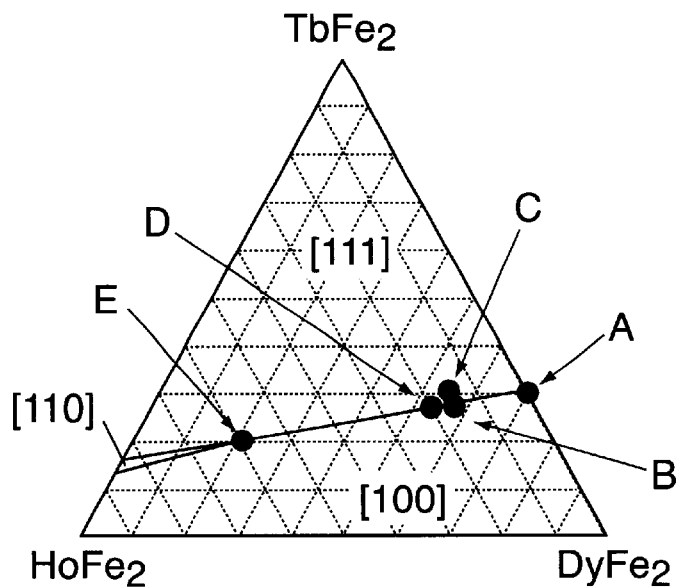
FIG. 1 is a plot of the composition of 5 samples (A, B, C, D, and E) of magnetostrictive materials on a ternary phase diagram for the $TbFe_2$-$HoFe_2$-$DyFe_2$ system.

Sample A is the room temperature Terfenol-D composition and was used to provide a control for the experiment, while sample E is at the zero anisotropy composition found by C. Williams, and N. Koon, *Physica* B 86–88, 14 (1977). FIG. 1 shows these compositions on a ternary phase diagram for the $TbFe_2$-$HoFe_2$-$DyFe_2$ system. The regions marked [100], [111], and [110] indicate the direction of the easy magnetization axis. The locations of the samples A, B, C, D, and E are indicated. The line of minimum anisotropy runs through samples A and E. These relatively small diameter samples appear to be of very good quality since sample A (Terfenol-D) has a large magnetostriction and markedly lower hysteresis losses than larger size rods of the same composition. We believe this is due to good alignment of the [112] platelets in these samples.

The magnetization and magnetostriction at compressive stresses T (1 MPa $\leq |T| \leq$ 70 MPa) and fields H(0 $\leq$ H $\leq$ 135 kA/m) were measured at room temperature. The apparatus used a dead weight to apply the stress; length changes were measured by linear variable differential transformers (LVDTs), and the magnetization was measured by a small pickup coil wound around the sample.

Composition and saturation magnetostriction $S_{sat}$ of the $Tb_xDy_yHo_zFe_{1.95}$ (x+y+z=1) samples reported in this study.

TABLE 1

Composition and saturation magnetostriction $S_{sat}$ of the $Tb_xDy_yHo_zFe_{1.95}$ (x + y + z = 1) samples reported in this study.

| Sample | x | y | z | $S_{sat}$ (ppm) |
|---|---|---|---|---|
| A | 0.30 | 0.70 | 0.00 | 1850 |
| B | 0.28 | 0.57 | 0.15 | 1650 |
| C | 0.30 | 0.55 | 0.15 | 1600 |
| D | 0.26 | 0.54 | 0.20 | 1500 |
| E | 0.20 | 0.22 | 0.58 | 1000 |

Figure 2:
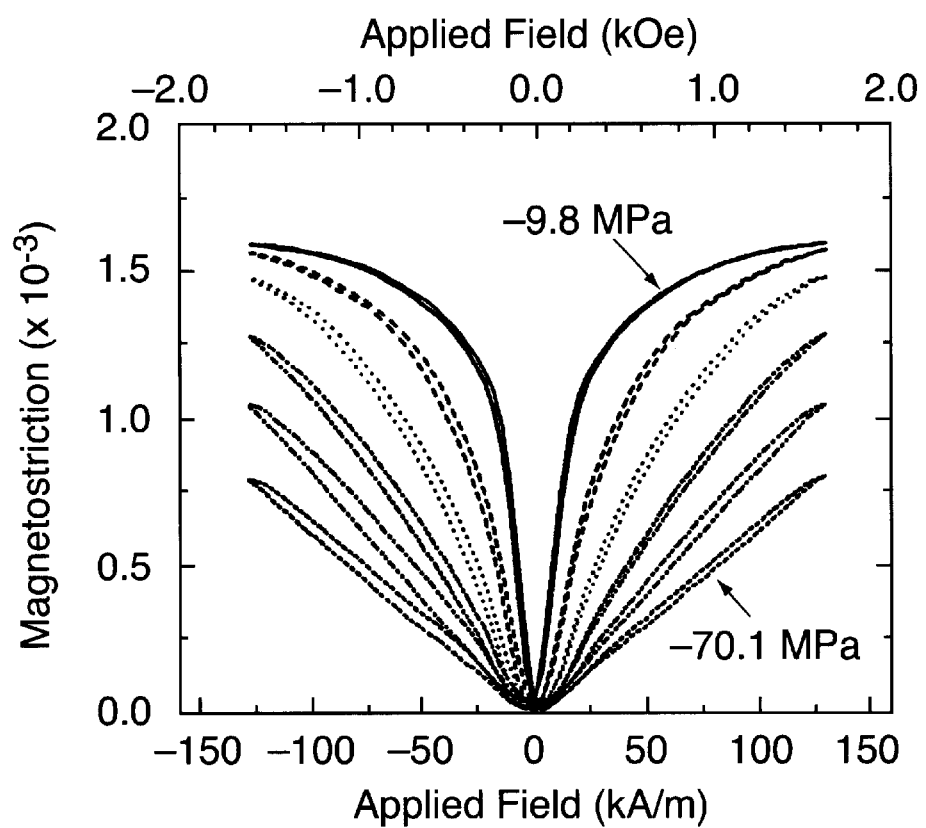
FIG. 2 shows the magnetostriction versus applied magnetic field for sample B, 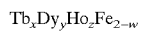$Tb_{0.28}Dy_{0.57}Ho_{0.15}Fe_{1.95}$, for various stresses.

FIG. 2 shows the magnetostriction versus applied magnetic field for sample B, $Tb_{0.28}Dy_{0.57}Ho_{0.15}Fe_{1.95}$, for stresses of −9.8, −21.9, −33.9, −46.0, −58.1, and −70.1 Mpa. The results are typical of those for all of the samples. The primary objective of this work is to determine how the width of the hysteresis loop depends upon the holmium (Ho) concentration and compare this dependence with the decrease in magnetostriction as the Ho concentration was increased. For purposes of this comparison, we used application oriented measures of magnetostriction and hysteresis. The peak-to-peak magnetostriction $S_{pp}$ is defined as the change in strain over a range of 71.6 kA.m (~900 Oe) centered around the field at which the piezomagnetic constant d has a maximum, subject to the restriction that the field is always positive, i.e., the center field is $\geq$ 35.8 kA/m. The hysteresis width $W_h$ is defined as the average width of the magnetic field-strain curve at the field where d has a maximum.

FIG. 3 shows the peak-to-peak magnetostriction $S_{pp}$ versus holmium (Ho) concentration as a function of applied stress for samples A, B, D, and E, the samples that lie along the minimum anisotropy line. (Sample C, which lies on the Tb rich side of the minimum anisotropy line, has a slightly higher magnetostriction.)

FIG. 4 shows the hysteresis width $W_h$ vs Ho concentration for the samne 4 samples (A, B, D, and E) for applied stresses of −9.8(filled square), −21.9 (filled triangle), −33.9(filled diamond), −46.0 (filled circle), −58.1(open square), and −70.1 MPa (open circle). For sample D ($Tb_{0.26}Dy_{0.54}Ho_{0.2}Fe_{1.95}$), at T=−9.8 MPa, an artifact of our definition of the width gave meaningless results, i.e., part of the 71.6 kA/m magnetic field range used to determine $W_h$ is at fields where the magnetostriction is saturated.

Table 2 shows fractional change in peak-to-peak magnetostriction $\Delta S=[S_{pp}-S_{pp}(A)]/S_{pp}(A)$ and fractional change in hysteresis width $\Delta W=[W_h-Wh(A)]/W_h$ for samples B, C, D, and E as a function of applied stress (T). The reference values $S_{pp}(A)$ and $W_h(A)$ are the values for sample A (Terfenol-D).

TABLE 2

| T(MPa) | Sample B | | Sample C | | Sample D | | Sample E | |
|---|---|---|---|---|---|---|---|---|
| | ΔW | ΔS | ΔW | ΔS | ΔW | ΔS | ΔW | ΔS |
| −9.8 | −49% | −9.4% | −3% | −16% | no data | −26% | −54% | −46% |
| −21.9 | −20% | −8.5% | −10% | −12% | −10% | −16% | −48% | −39% |
| −33.9 | −23% | −6.7% | −13% | −5.7% | −54% | −10% | −62% | −29% |
| −46.0 | −26% | −5.9% | −15% | 0.4% | −44% | −7.0% | −72% | −18% |
| −58.1 | −18% | −4.2% | −33% | 2.6% | −61% | −5.1% | −81% | −9.3% |
| −70.1 | −36% | −7.2% | −21% | 5.1% | −68% | −6.0% | −36% | −0.1% |

Obviously, other modifications and variations of the present invention may be possible in light of the foregoing teachings. It is therefore to be understood that within the scope of the appended claims the invention may be practiced otherwise than as specifically described.

What is claimed is:

1. A method of converting magnetic energy into mechanical energy, the mechanical energy being in the form of a change of dimension in material, comprising the steps of:

subjecting a magnetostrictive material of the formula $Tb_xDy_yHo_zFe_{2-w}$ to a change in magnetic field, wherein $0.24 \leq x \leq 0.28$, $0.52 \leq y \leq 0.56$, $0.13 \leq z \leq 0.22$, $x+y+z=1$, and $0 \leq w \leq 0.20$; and prestressing said magnetostrictive material at an operating range of stress for said magnetostrictive material by applying a compressive force of from about 5 to about 100 MPa to said magnetostrictive material.

2. The method of claim 1, wherein a compressive force of from 30 to 100 MPa is applied to prestress said magnetostrictive material.

3. The method of claim 2, wherein a compressive force of from 50 to 100 MPa is applied to prestress said magnetostrictive material.

4. The method of claim 3, wherein a compressive force of from 50 to 80 MPa is applied to prestress said magnetostrictive material.

5. The method of claim 4, wherein a compressive force of from 60 to 80 MPa is applied to prestress said magnetostrictive material.

6. The method of claim 1, wherein a compressive force of from 5 to 30 MPa is applied to prestress said magnetostrictive material.

7. The method of claim 6, wherein a compressive force of from 10 to 25 MPa is applied to prestress said magnetostrictive material.

8. The method of claim 1, wherein $0.25 \leq x \leq 0.27$.

9. The method of claim 1, wherein $0.53 \leq y \leq 0.55$.

10. The method of claim 1, wherein $0.17 \leq z \leq 0.21$.

11. The method of claim 1, wherein $0 \leq w \leq 0.10$.

12. The method of claim 1, wherein $0.25 \leq x \leq 0.27$, $0.53 \leq y \leq 0.55$, $0.17 \leq z \leq 0.21$, and $0 \leq w \leq 0.10$.

13. The method of claim 12, wherein x is about 0.26, y is about 0.54, and z is about 0.20.

14. The method of claim 13, wherein w is about 0.05.

15. The method of claim 1, wherein for a given Ho concentration, the concentrations of Dy and Tb are selected to place the composition of said magnetostrictive material on a linear minimum anisotropy line formed by compounds of the form:

$v(Tb_{0.15}Ho_{0.85}Fe_{2-w}) + (1-v)(Tb_{0.3}Dy_{0.7}Fe_{2-w})$, wherein $0 \leq v \leq 1$ and $0 \leq w \leq 0.20$.

16. The method of claim 15, wherein $0 \leq w \leq 0.10$.

17. The method of claim 1, wherein said magnetostrictive material is isotropic.

18. The method of claim 1, wherein said magnetostrictive material is a grain-oriented polycrystalline material.

19. The method of claim 1, wherein said magnetostrictive material is a single crystal material.

20. A transducer for converting magnetic energy into mechanical energy, comprising:

a magnetostrictive element comprising a magnetostrictive material of the formula $Tb_xDy_yHo_zFe_{2-w}$, wherein $0.24 \leq x \leq 0.28$, $0.52 \leq y \leq 0.56$, $0.13 \leq z \leq 0.22$, $x+y+z=1$, and $0 \leq w \leq 0.20$, said magnetostrictive element being prestressed at an operating range of stress for said magnetostrictive element by applying a compressive force of from about 5 to about 100 MPa to said magnetostrictive element; and conductive means for generating a magnetic field in said magnetostrictive element.

21. The transducer of claim 20, wherein a compressive force of from 30 to 100 MPa is applied to prestress said magnetostrictive element.

22. The transducer of claim 21, wherein a compressive force of from 50 to 100 MPa is applied to prestress said magnetostrictive element.

23. The transducer of claim 22, wherein a compressive force of from 50 to 80 MPa is applied to prestress said magnetostrictive element.

24. The transducer of claim 23, wherein a compressive force of from 60 to 80 MPa is applied to prestress said magnetostrictive element.

25. The transducer of claim 20, wherein a compressive force of from 5 to 30 MPa is applied to prestress said magnetostrictive element.

26. The transducer of claim 25, wherein a compressive force of from 10 to 25 MPa is applied to prestress said magnetostrictive element.

27. The transducer of claim 20, wherein $0.25 \leq x \leq 0.27$.

28. The transducer of claim 20, wherein $0.53 \leq y \leq 0.55$.

29. The transducer of claim 20, wherein $0.17 \leq z \leq 0.21$.

30. The transducer of claim 20, wherein $0 \leq w \leq 0.10$.

31. The transducer of claim 20, wherein $0.25 \leq x \leq 0.27$, $0.53 \leq y \leq 0.55$, $0.17 \leq z \leq 0.21$, and $0 \leq w \leq 0.10$.

32. The transducer of claim 31, wherein x is about 0.26, y is about 0.54, and z is about 0.20.

33. The transducer of claim 32, wherein w is about 0.05.

34. The transducer of claim 20, wherein for a given Ho concentration, the concentrations of Dy and Tb are selected to place the composition of the magnetostrictive material forming said magnetostrictive element on a linear minimum anisotropy line formed by compounds of the form:

$v(Tb_{0.15}Ho_{0.85}Fe_{2-w})+(1-v)(Tb_{0.3}Dy_{0.7}Fe_{2-w})$, wherein $0 \leq v \leq 1$ and $0 \leq w \leq 0.20$.

35. The transducer of claim 34, wherein $0 \leq w \leq 0.10$.

36. The transducer of claim 20, wherein the magnetostrictive material forming said magnetostrictive element is isotropic.

37. The transducer of claim 20, wherein the magnetostrictive material forming said magnetostrictive element is a grain-oriented polycrystalline material.

38. The transducer of claim 20, wherein the magnetostrictive material forming said magnetostrictive element is a single crystal material.

39. An electrical element, comprising: a composition of matter having the formula $Tb_xDy_yHo_zFe_{2-w}$, wherein $0.24 \leq x \leq 0.28$, $0.52 \leq y \leq 0.56$, $0.13 \leq z \leq 0.22$, $x+y+z=1$, and $0 \leq w \leq 0.20$, said electrical element being prestressed at an operating range of stress for said electrical element.

40. The electrical element of claim 39, wherein said electrical element is under a compressive force in a range of 5 to 100 MPa.

41. The electrical element of claim 39, wherein said electrical element is under a compressive force in a range of 30 to 100 MPa.

42. The electrical element of claim 39, wherein said composition of matter is in an isotropic form.

43. The electrical element of claim 39, wherein said composition of matter is in a grain-oriented form.

44. The electrical element of claim 39, wherein said composition of matter is in a single-crystal form.

45. The electrical element of claim 39, wherein said composition of matter is prepared by a free-standing zone melt method.

* * * * *